United States Patent
Watanabe

(10) Patent No.: US 10,778,258 B2
(45) Date of Patent: Sep. 15, 2020

(54) MEMORY SYSTEM AND DECODING METHOD

(71) Applicant: TOSHIBA MEMORY CORPORATION, Minato-ku (JP)

(72) Inventor: Daiki Watanabe, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 11 days.

(21) Appl. No.: 16/290,046

(22) Filed: Mar. 1, 2019

(65) Prior Publication Data

US 2020/0091941 A1 Mar. 19, 2020

(30) Foreign Application Priority Data

Sep. 18, 2018 (JP) ................. 2018-174119

(51) Int. Cl.
G11C 29/00 (2006.01)
H03M 13/45 (2006.01)
G11C 29/52 (2006.01)
G06F 11/10 (2006.01)

(52) U.S. Cl.
CPC ......... *H03M 13/45* (2013.01); *G06F 11/1068* (2013.01); *G11C 29/52* (2013.01)

(58) Field of Classification Search
CPC .. G06F 11/1068; G06F 11/1012; G11C 29/52; G11C 2029/0411; G11C 5/143; H03M 13/45; H03M 13/2963; H03M 13/1105; H03M 13/3715; H03M 13/2906; H03M 13/6325; H03M 13/1111; H03M 13/3927; H03M 13/458
See application file for complete search history.

(56) References Cited

U.S. PATENT DOCUMENTS

| | | | |
|---|---|---|---|
| 8,462,549 B2 | 6/2013 | Haratsch et al. | |
| 9,363,782 B2 | 6/2016 | Tenny | |
| 2011/0268168 A1 | 11/2011 | Dybdal et al. | |
| 2019/0087107 A1 | 3/2019 | Watanabe | |

FOREIGN PATENT DOCUMENTS

| | | |
|---|---|---|
| JP | 2012-504842 | 2/2012 |
| JP | 2014-520489 | 8/2014 |
| JP | 2019-57812 A | 4/2019 |

*Primary Examiner* — Guerrier Merant
(74) *Attorney, Agent, or Firm* — Oblon, McClelland, Maier & Neustadt, L.L.P.

(57) ABSTRACT

According to one embodiment, a memory system includes a nonvolatile memory and a memory controller. The memory controller calculates a reliability metric on the basis of at least a soft-decision input value calculated on the basis of read information that is read from the nonvolatile memory, and a decoded word, stores reference information that is a history of a plurality of reliability metrics or statistical information obtained from the history, calculates reliability from the reliability metric by using correspondence information, calculates decoding information on the basis of the decoded word and the reliability, and updates the correspondence information on the basis of the reference information.

20 Claims, 12 Drawing Sheets

| CODE | ROW 1 | ROW 2 | ROW 3 | ROW 4 | ROW 5 | COL-UMN 1 | COL-UMN 2 | COL-UMN 3 | COL-UMN 4 | COL-UMN 5 |
|---|---|---|---|---|---|---|---|---|---|---|
| m | 1 | 6 | 1 | 7 | 0 | 8 | 7 | 1 | 1 | 0 |

| m | 0 | 1 | 2 | 3 | 4 | 5 | 6 | 7 | 8 | 9 |
|---|---|---|---|---|---|---|---|---|---|---|
| NUMBER OF APPEARANCE | 2 | 4 | 0 | 0 | 0 | 0 | 1 | 2 | 1 | 0 |
| $\hat{P}(m)$ | 0.2 | 0.4 | 0 | 0 | 0 | 0 | 0.1 | 0.2 | 0.1 | 0 |

| m | 0 | 1 | 2 | 3 | 4 | 5 | 6 | 7 | 8 | 9 |
|---|---|---|---|---|---|---|---|---|---|---|
| $\hat{P}(m)$ | 0.2 | 0.4 | 0 | 0 | 0 | 0 | 0.1 | 0.2 | 0.1 | 0 |

| m | 0 | 1 | 2 | 3 | 4 | 5 | 6 | 7 | 8 | 9 |
|---|---|---|---|---|---|---|---|---|---|---|
| $P(m|A)$ | 0.33 | 0.67 | 0 | 0 | 0 | 0 | 0 | 0 | 0 | 0 |
| $P(m|B)$ | 0 | 0 | 0 | 0 | 0 | 0 | 0.25 | 0.50 | 0.25 | 0 |

| CODE | ROW 1 | ROW 2 | ROW 3 | ROW 4 | ROW 5 | COL-UMN 1 | COL-UMN 2 | COL-UMN 3 | COL-UMN 4 | COL-UMN 5 |
|---|---|---|---|---|---|---|---|---|---|---|
| m | 1 | 6 | 1 | 7 | 0 | 8 | 7 | 1 | 1 | 0 |

| m | 0 | 1 | 2 | 3 | 4 | 5 | 6 | 7 | 8 | 9 |
|---|---|---|---|---|---|---|---|---|---|---|
| NUMBER OF TIMES OF APPEARANCE OF DIMENSION 1 | 1 | 2 | 0 | 0 | 0 | 0 | 1 | 1 | 0 | 0 |
| $\hat{P}(m)$ | 0.2 | 0.4 | 0 | 0 | 0 | 0 | 0.2 | 0.2 | 0 | 0 |
| m | 0 | 1 | 2 | 3 | 4 | 5 | 6 | 7 | 8 | 9 |
| NUMBER OF TIMES OF APPEARANCE OF DIMENSION 2 | 1 | 2 | 0 | 0 | 0 | 0 | 0 | 1 | 1 | 0 |
| $\hat{P}(m)$ | 0.2 | 0.4 | 0 | 0 | 0 | 0 | 0 | 0.2 | 0.2 | 0 |

MEMORY SYSTEM AND DECODING METHOD

CROSS-REFERENCE TO RELATED APPLICATIONS

This application is based upon and claims the benefit of priority from Japanese Patent Application No. 2018-174119, filed on Sep. 18, 2018; the entire contents which are incorporated herein by reference.

FIELD

Embodiments described herein relate generally to a memory system.

BACKGROUND

In the memory system, generally, error correction encoded data is stored to protect data that is stored. According to this, when reading data stored in a memory system, decoding with respect to the error correction encoded data is performed.

DETAILED DESCRIPTION

In general, according to one embodiment, a memory system includes a nonvolatile memory and a memory controller. The nonvolatile memory stores an error correction code. The memory controller performs processing of acquiring read information from the nonvolatile memory, calculates a reliability metric that is information having a correlation with reliability of a decoded word on the basis of at least a soft-decision input value calculated on the basis of the read information and the decoded word decoded by the soft-decision input value, stores reference information that is a history of a plurality of reliability metrics or statistical information obtained from the history, calculates reliability from the reliability metric by using correspondence information for calculating the reliability from the reliability metric, calculates decoding information on the basis of the decoded word and the reliability, and updates the correspondence information on the basis of the reference information.

Hereinafter, a memory according to embodiments will be described in detail with reference to the accompanying drawings. Furthermore, the invention is not limited by the embodiments.

In recent, a memory system using a nonvolatile memory such as a NAND type flash memory has been used at various locations by utilizing a characteristic of a high speed. However, there is a possibility that an error caused by the elapse of time from storage in the nonvolatile memory, noise that occurs in reading and writing, and the like may be included in data that is read from the nonvolatile memory. Accordingly, typically, encoding processing using an error correction code is executed with respect to data that is stored in the nonvolatile memory, and decoding processing using the error correction code is executed in reading to remove the error that is included in the read data.

Figure 1:
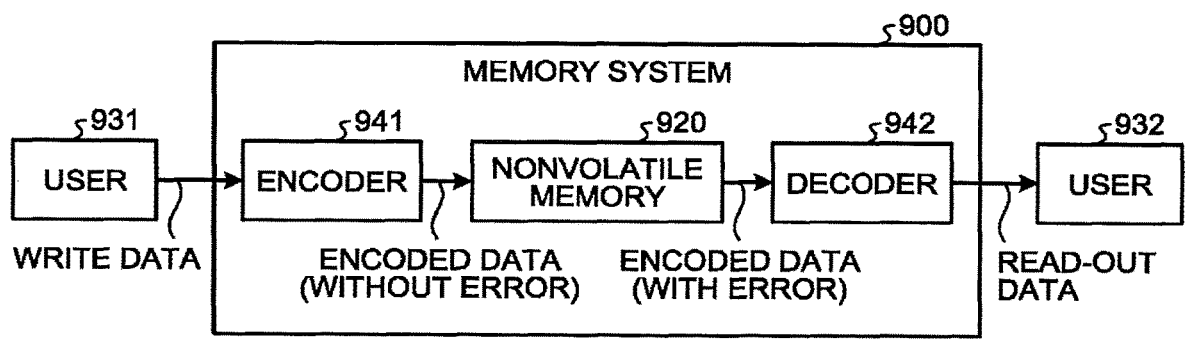
FIG. 1 is a view illustrating a general flow of an operation of protecting data with an error correction code.

FIG. 1 is a view illustrating a general flow of an operation of protecting data with the error correction code. Furthermore, a user in the following description may be, for example, an information processing apparatus such as a personal computer, a server apparatus, a portable information apparatus, and a digital still camera.

A user 931 transmits write target data (hereinafter, referred to as "write data") to a memory system 900. The memory system 900 encodes the write data received from the user 931 by using an encoder 941, and writes encoded data (code word) generated through the encoding in a nonvolatile memory 920. Accordingly, basically, any error is not included in the encoded data that is written in the nonvolatile memory 920.

The encoded data stored in the nonvolatile memory 920 is read in accordance with a read request from a user 932. Here, there is a possibility that an error may be included in the read encoded data. Here, an original code word is restored by executing decoding while removing the error included in the read encoded data by using a decoder 942. Then, the original code word or the restored write data before encoding is transmitted to the user 932. Furthermore, the user 932 who issues the read request may be the same user as the user 931 who issues the write request or may be an additional user.

Here, it is assumed that the encoder 941 encodes the write data into a code word constituted by binary information (bit) expressed by "0" or "1", and the code word is stored in the nonvolatile memory 920 as the binary information. Hereinafter, in reading of data from the nonvolatile memory 920, in a case where stored data is read as the binary information indicating "0" or "1" and is input to the decoder 942, the input information is referred to as "hard-decision input (hard-input)". In contrast, in a case where stored data is read as information of a probability of "0" or a probability of "1" and is input to the decoder 942, the probability information is referred to as "soft-decision input (soft-input)".

In addition, a decoding result output from the decoder 942 is binary information indicating that the original write data is "0" or "1", the output information is referred to as "hard-decision output (hard-output)". In contrast, in a case where the probability information indicating that the original write data is "0" or "1" is included in the decoding result that is output by the decoder 942, the output information is referred to as "soft-decision output (soft-output)".

In a case of using the soft-decision input as an input to the decoder 942, it is possible to perform decoding using a lot of pieces of information in comparison to a case of using the hard-decision input. According to this, in a case where a lot of errors are included in the read data, using the soft-decision input as the input to the decoder 942 makes it possible to raise a probability of decoding correct data.

As the soft-decision input value and the soft-decision output value, for example, with regard to a binary code that expresses information by a bit of "0" or "1", expression of a log-likelihood-ratio (LLR) that is a natural logarithm of a ratio between a probability in which a bit is "0" and a probability in which a bit is "1" is frequently used. The code word that is a binary code can be expressed as a vector of a bit value, and thus a soft-decision input value and a soft-decision output value of the binary code can be expressed as a vector of LLR (real number value). In the following embodiments, a case where probability information of the soft-decision input value and the soft-decision output value is expressed as a vector of the LLR is exemplified for simplification of explanation, but various modifications can be made without limitation to the case.

A decoder that performs the soft-decision output with respect to the soft-decision input (hereinafter, referred to as "soft-input soft-output (SISO) decoder") can be used, for example, as a component code decoder of a multi-dimensional error correction code.

Here, t multi-dimensional error correction code represents that a symbol that is at least one or more constituent units of the error correction code is protected by a plurality of small-scaled component codes in a multiple manner. In addition, for example, one symbol is constituted by one bit (element of a binary field) or an element of an alphabet such as a finite field other than the binary field.

Figure 2:
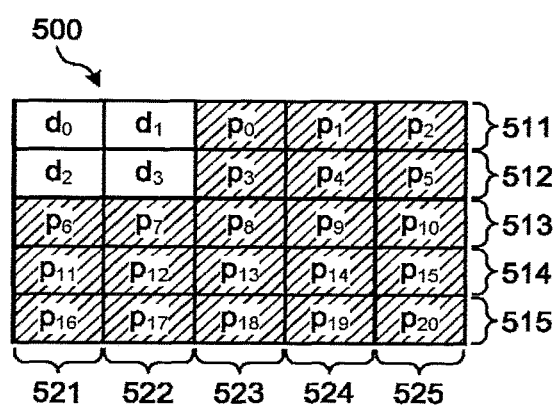
FIG. 2 is a view illustrating an example of a product code.

As an example of the multi-dimensional error correction code, a product code is illustrated in FIG. 2. A product code 500 illustrated in FIG. 2 has a structure in which respective information bits (may be symbols) $d_0$ to $d_3$ that are constituent units are protected by Hamming code 511 to 515, and 521 to 525 having an information length of two bits and a parity length of two bits both in a row direction (horizontal direction in the drawing) and in a column direction (vertical direction in the drawing). In the product code 500, all of the information bits $d_0$ to $d_3$ and the parity bits $p_0$ to $p_{20}$ are doubly protected by the Hamming codes in the row direction and the Hamming codes in the column direction. In the product code illustrated in FIG. 2, all symbols are doubly protected by component codes in the row direction (referred to as "dimension 1") and in the column direction (referred to as "dimension 2"). Furthermore, the multi-dimensional error correction code is not limited thereto and may be a generalized low density parity check code (generalized LDPC code), for example. In a general multi-dimensional error correction code including the generalized LDPC code, a multiplicity of protection may be different for every symbol. In addition, component codes cannot be classified into groups including a dimension 1 and a dimension 2, but the present technology is also applicable to the code configuration.

Figure 3:
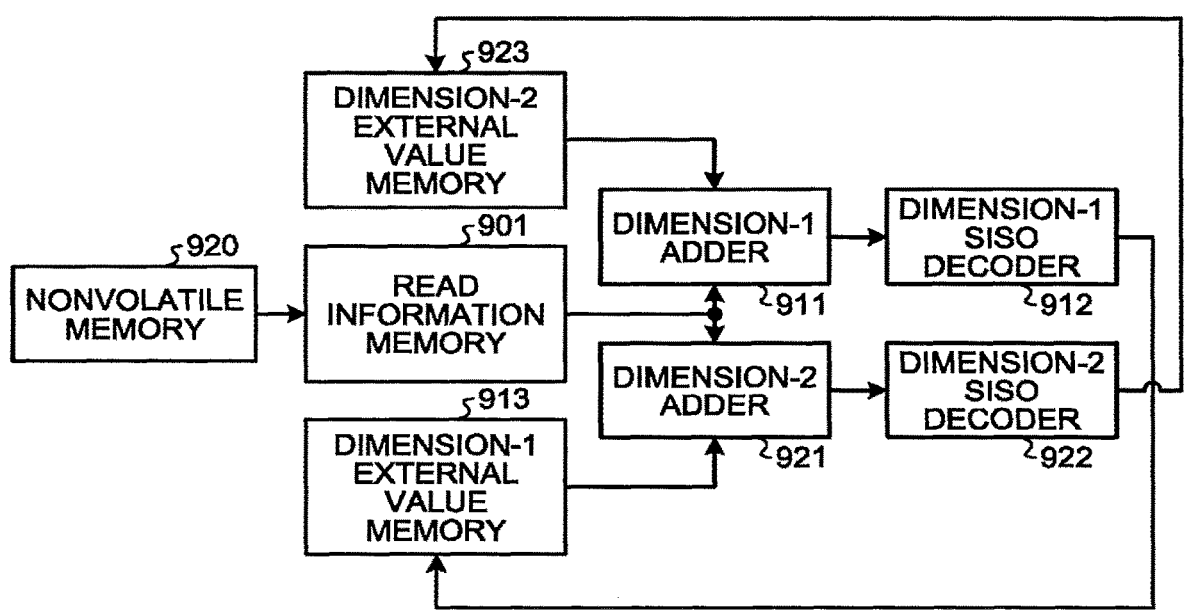
FIG. 3 is a block diagram illustrating an example of a functional block that executes turbo decoding with respect to a two-dimensional error correction code.

With respect to the multi-dimensional error correction ode, soft-decision repetitive decoding can be performed. Hereinafter, description will be given of an example in which turbo decoding is used as soft-decision repetitive decoding, but any soft-decision repetitive decoding other than the turbo decoding may be used. FIG. 3 is a view illustrating an example of a functional block that executes the turbo decoding with respect to a two-dimensional error correction code. In addition, FIG. 4 is a flowchart illustrating an example of a processing flow by the functional block illustrated in FIG. 3.

As illustrated in FIG. 3, a functional block that executes turbo decoding with respect to a two-dimensional error correction code includes a read information memory 901, a dimension-1 adder 911, a dimension-1 SISO decoder 912, a dimension-1 external value memory 913, a dimension-2 adder 921, a dimension-2 SISO decoder 922, and a dimension-2 external value memory 923.

Figure 4:
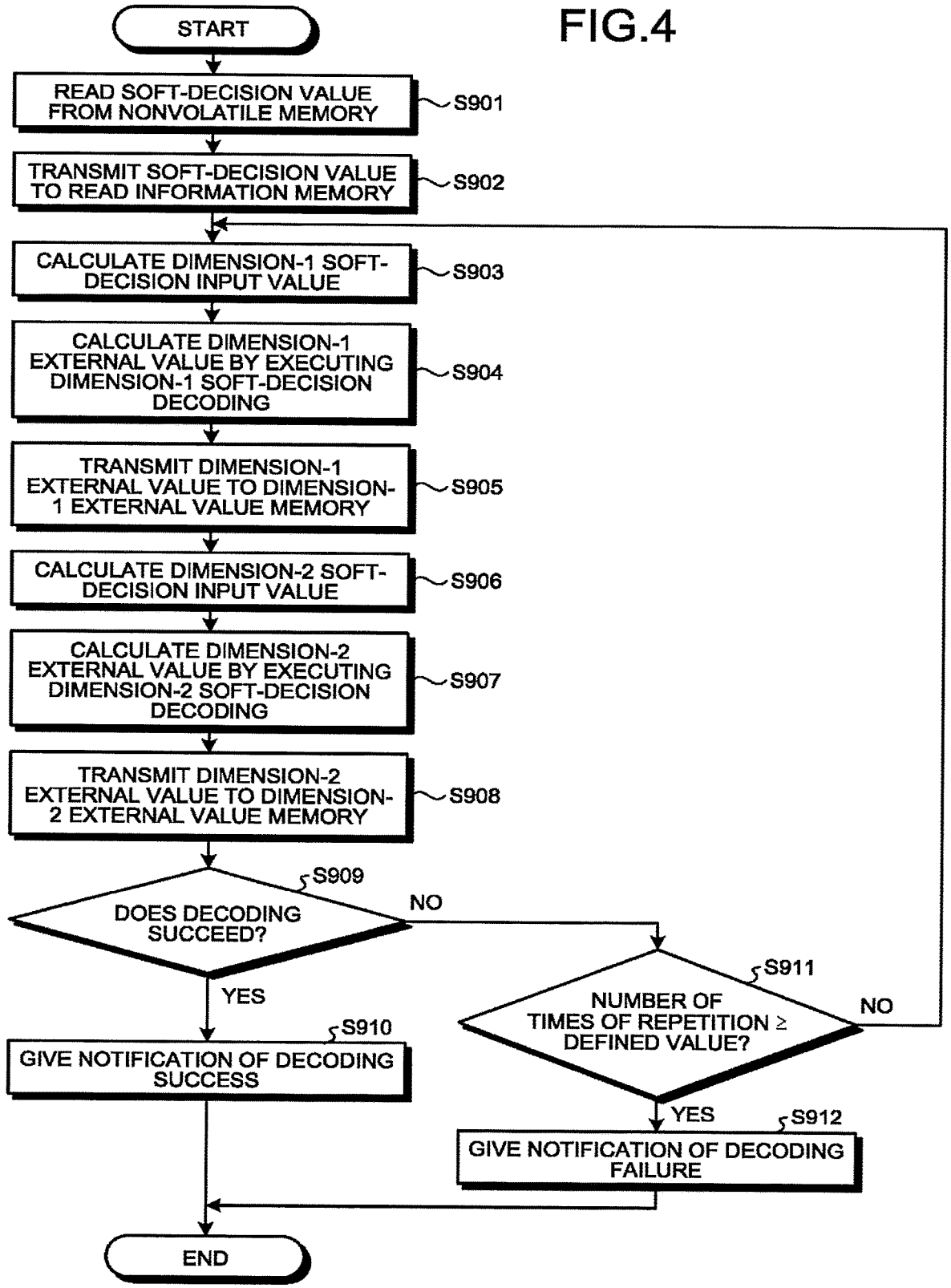
FIG. 4 is a flowchart illustrating an example of a processing flow by the functional block illustrated in FIG. 3.

In a turbo decoding operation by the functional block, as illustrated in FIG. 4, an error correction code is first read from the nonvolatile memory 920 as a soft-decision value (Step S901). The error correction code of the read soft-decision value is transmitted to the read information memory 901 as read information and is stored therein (Step S902).

Next, the read information in the read information memory 901 and a dimension-2 external value in the dimension-2 external value memory 923 are added by the dimension-1 adder 911, and thus a dimension-1 soft-decision input value (=read information+a dimension-2 external value) is calculated (Step S903). Furthermore, it is assumed that both the dimension-1 external value memory 913 and the dimension-2 external value memory 923 are reset (zero clear) in activation of the present operation.

Then, the dimension-1 soft-decision input value calculated by the dimension-1 adder 911 is input to the dimension-1 SISO decoder 912 for every component code. The dimension-1 SISO decoder 912 executes dimension-1 soft-decision decoding with respect to the dimension-1 soft-decision input value that is input to calculate a dimension-1 external value (Step S904). The dimension-1 external value that is calculated is transmitted to the dimension-1 external value memory 913 and is stored therein (Step S905).

Next, read information in the read information memory 901 and a dimension-1 external value in the dimension-1 external value memory 913 are added by the dimension-2 adder 921, and thus a dimension-2 soft-decision input value (=read information+a dimension-1 external value) is calculated (Step S906).

Next, the dimension-2 soft-decision input value that is calculated by the dimension-2 adder 921 is input to the dimension-2 SISO decoder 922 for every component code. The dimension-2 SISO decoder 922 executes dimension-2 soft-decision decoding with respect to the dimension-2 soft-decision input value that is input to calculate a dimension-2 external value (Step S907). The dimension-2 external value that is calculated is transmitted to the dimension-2 external value memory 923 and is stored therein (Step S908).

Next, determination is made as to whether or not decoding succeeds (Step S909). Determination as success of the decoding may be made, for example, when a decoded word that can be determined as a correct word is found. In a case where decoding succeeds (YES in Step S909), an external control unit and the like are notified of a decoded word that is found in combination with the success of the decoding (Step S910), and this operation is terminated. On the other hand, in a case where the decoding fails (NO in Step S909), determination is made as to whether or not the number of times of repetition of this operation reaches a defined value that is set in advance (Step S911). In a case where the number of times of repetition does not reach the defined value (NO in Step S911), the operation returns to Step S903 and the subsequent operation is executed. In addition, in a case where the number of times of repetition reaches the defined value (YES in Step S911), the external control unit and the like are notified of decoding failure (Step S912), and this operation is terminated. Furthermore, for example, the number of times of repetition may be the number of times of repetition of the operation in Steps S903 to S908 in FIG. 4.

Next, description will be given of an example of a decoding algorithm that calculates an external value and is applicable to the dimension-1 SISO decoder 912 and the dimension-2 SISO decoder 922. For example, reliability is calculated from a reliability metric, and the external value can be calculated by using the reliability that is calculated. The reliability employs a Bayesian probability for which the decoded word is the true decoded word (correct decoded word) or an approximate value thereof and which is calculated with the given soft-decision input value. The reliability metric is information having correlation with the reliability. For example, the reliability is calculated by using correspondence information for calculating the reliability from the reliability metric. For example, the correspondence information is a reliability calculation function for calculating the reliability from the reliability metric. The reliability calculation function may be expressed in a table format in which the reliability metric and the reliability are correlated with each other.

Figure 5:
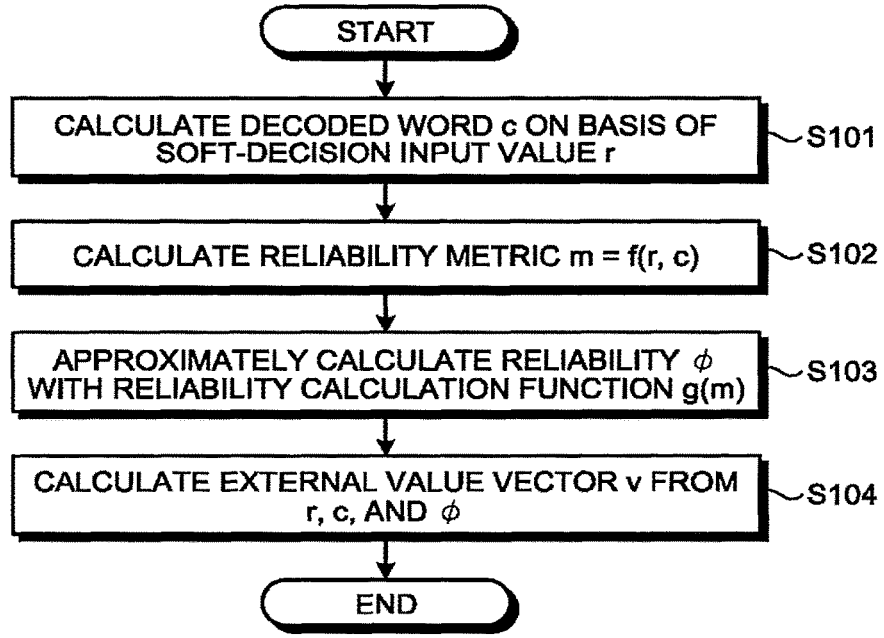
FIG. 5 is a flowchart illustrating an example of calculation processing of an external value using reliability.

FIG. 5 is a flowchart illustrating an example of calculation processing of an external value by using the reliability. In FIG. 5, description will be given of a case where the dimension-1 SISO decoder 912 calculates a dimension-1 external value (Step S904) as an example, but the same procedure is also applicable to a case where the dimension-2 SISO decoder 922 calculates a dimension-2 external value (Step S907).

The dimension-1 SISO decoder 912 inputs soft-decision input value r and calculates a decoded word c on the basis of the soft-decision input value r (Step S101). For example, the soft-decision input value r corresponds to the dimension-1 soft-decision input value.

The dimension-1 SISO decoder 912 calculates a reliability metric m=f(r, c) from the soft-decision input value r and the decoded word c (Step S102). For example, the reliability metric m is a distance between the soft-decision input value r and the decoded word c. That is, the function f(r, c) for calculating the reliability metric m can use, for example, a distance function $f(r, c)=|r-(1-2c)|^2$ between the soft-decision input value r and the decoded word c. The reliability metric m can use, for example, norm $|r|^2$ of the soft-decision input value r and the like without limitation to the distance function. In this example, the reliability metric m is a one-dimensional value, but may be a multi-dimensional vector including, for example, a distance and norm without limitation to the one-dimensional value.

The dimension-1 SISO decoder 912 calculates a reliability, that is, a probability $\phi=P(c=x|r)$ in that the decoded word c is the true decoded word x as $\phi \approx g(m)$ by using a reliability calculation function g(m) (Step S103).

The dimension-1 SISO decoder 912 calculates an external value vector v from the soft-decision input value r, the decoded word c, and the probability $\phi$, and outputs the external value vector v (Step S104). For example, a soft-decision input value of $i^{th}$ bit is set as $r_i$, a value of $i^{th}$ bit of a decoded word is set as $c_i$, and an external value $v_i$ of $i^{th}$ bit is calculated by the following Expression (1).

$$v_i = (1 - 2c_i)\log\left(\frac{\phi + \exp((1 - 2c_i)r_i)}{1 - \phi}\right) - r_i \quad (1)$$

Furthermore, Expression (1) is an example, there is no limitation thereto. Any calculation method may be used as long as the method is a method of calculating the external value $v_i$ of respective elements of the external value vector v by using the soft-decision input value $r_i$, the decoded word $c_i$, and the probability $\phi$.

An external value of each dimension corresponds to decoding information that is used in decoding processing. For example, the dimension-1 soft-decision input value calculated from the dimension-2 external value may be input to the dimension-1 SISO decoder 912 to be used in dimension-1 soft-decision decoding by the dimension-1 SISO decoder 912. In addition, the dimension-2 soft-decision input value calculated from the dimension-1 external value may be input to the dimension-2 SISO decoder 922 to be used in dimension-2 soft-decision decoding by the dimension-2 SISO decoder 922.

As described above, the reliability calculation function g(m) is a function that is used to approximately obtain reliability, that is, the probability $\phi$ in which the decoded word c is the true decoded word x by using the reliability metric m. The further the reliability calculation function g(m) accurately approximates the probability $\phi$, the higher correction capability can be accomplished as a result.

First Embodiment

Figure 6:
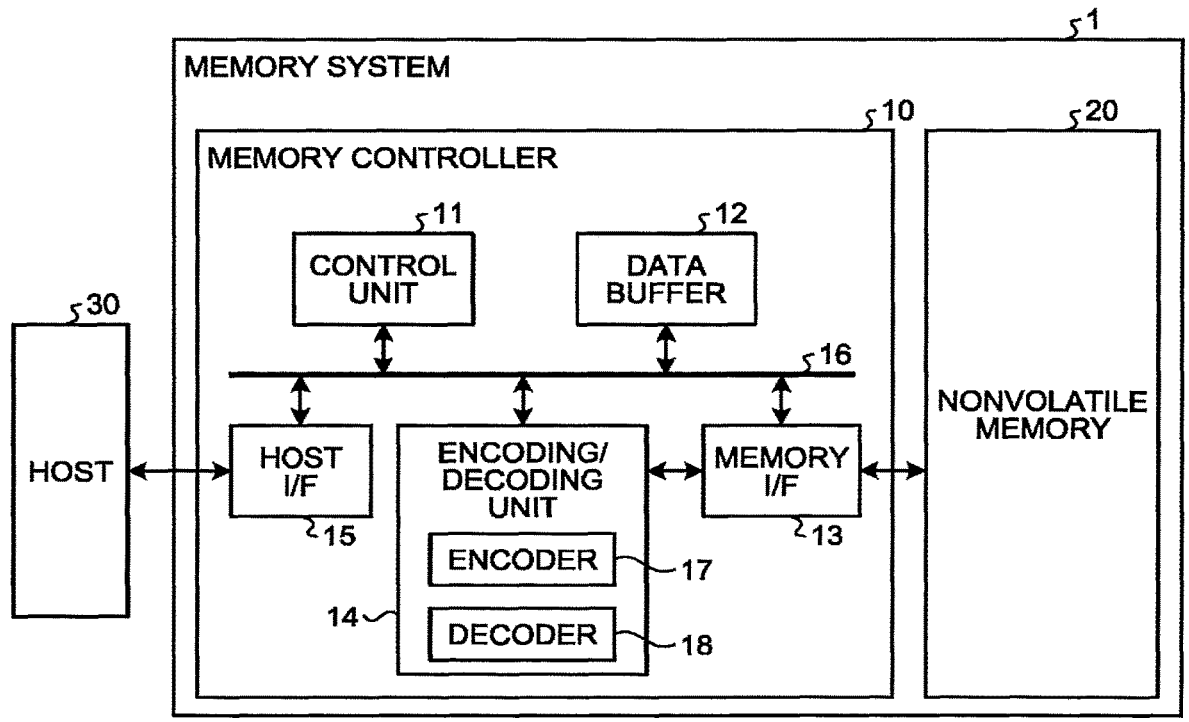
FIG. 6 is a block diagram illustrating a schematic configuration example of a memory system according to a first embodiment.

FIG. 6 is a block diagram illustrating a schematic configuration example of a memory system according to a first embodiment. As illustrated in FIG. 6, a memory system 1 includes a memory controller 10 and a nonvolatile memory 20. The memory system 1 can be connected to a host 30, and a state of being connected to the host 30 is illustrated in FIG. 6. For example, the host 30 may be an electronic device such as a personal computer and a portable terminal.

The nonvolatile memory 20 is a nonvolatile memory that stores data in a nonvolatile manner, and examples thereof include a NAND type flash memory (hereinafter, simply referred to as a NAND memory). In the following description, a case where the NAND memory is used as the nonvolatile memory 20 is exemplified, but a storage device such as a three-dimensional structure flash memory, a resistance random access memory (ReRAM), and a ferroelectric random access memory (FeRAM) other than the NAND memory can also be used as the nonvolatile memory 20. In addition, it is not necessary for the nonvolatile memory 20 to be a semiconductor memory, and this embodiment is applicable to various storage media other than the semiconductor memory.

The memory system 1 may be a memory card including the memory controller 10 and the nonvolatile memory 20 as one package, and the like, and may be a solid state drive (SSD) and the like.

The memory controller 10 controls writing in the nonvolatile memory 20 in accordance with a writing request from the host 30. In addition, the memory controller 10 controls reading from the nonvolatile memory 20 in accordance with a read request from the host 30. The memory controller 10 includes a host interface (host I/F) 15, a memory interface (memory I/F) 13, a control unit 11, an encoding/decoding unit (CODEC) 14, and a data buffer 12. The host I/F 15, the memory I/F 13, the control unit 11, the encoding/decoding unit 14, and the data buffer 12 are connected to each other through an internal bus 16.

The host I/F 15 performs processing according to an interface standard with the host 30, and outputs a command from the host 30, writing target user data, and the like to the internal bus 16. In addition, the host I/F 15 transmits user data that is read from the nonvolatile memory 20 and is restored, a response from the control unit 11, and the like to the host 30.

The memory I/F 13 performs writing processing in the nonvolatile memory 20 on the basis of an instruction from the control unit 11. In addition, the memory I/F 13 performs read processing from the nonvolatile memory 20 on the basis of an instruction from the control unit 11.

The data buffer 12 temporarily stores user data that is received from the host 30 by the memory controller 10 until the user data is stored in the nonvolatile memory 20. In addition, the data buffer 12 temporarily stores user data that is read from the nonvolatile memory 20 until the user data is transmitted to the host 30. As the data buffer 12, for example, a general-purpose memory such as a static random access memory (SRAM) and a dynamic random access memory (DRAM) can be used.

The control unit 11 collectively controls respective constituent elements of the memory system 1. When receiving a command from the host 30 through the host I/F 15, the control unit 11 performs control according to the command. For example, the control unit 11 instructs the memory I/F 13 to write user data and a parity in the nonvolatile memory 20 in accordance with a command from the host 30. In addition, the control unit 11 instructs the memory I/F 13 to read the user data and the parity from the nonvolatile memory 20 in accordance with a command from the host 30.

In addition, in a case of receiving a writing request of user data from the host 30, the control unit 11 determines a storage region (memory region) on the nonvolatile memory 20 with respect to user data that is stored in the data buffer 12. That is, the control unit 11 manages a writing destination of the user data. A correspondence between a logical address of the user data received from the host 30 and a physical address indicating a storage region on the nonvolatile memory 20 in which the user data is stored is stored as an address translation table.

In addition, in a case of receiving a read request from the host 30, the control unit 11 translates a logical address designated by the read request into a physical address by using the address translation table, and instructs the memory I/F 13 to perform reading from the physical address.

In the NAND memory, typically, writing and reading are performed in a data unit called a page, and erasing is performed in a data unit called a block. In this embodiment, a plurality of memory cells that are connected to the same word line are referred to as a memory cell group. In a case where a memory cell is the single level cell (SLC), one memory cell group corresponds to one page. In a case where the memory cell is a multiple level cell (MLC), the one memory cell group corresponds to a plurality of pages. In addition, each memory cell is connected to a word tire and is also connected to a hit line. Accordingly, the memory cell can be identified by an address that identifies the word line and an address that identifies the bit line.

User data that is transmitted from the host 30 is transmitted to the internal bus 16 and is temporarily stored in the data buffer 12. The encoding/decoding unit 14 encodes the user data stored in the nonvolatile memory 20 to generate a code word. In addition, the encoding/decoding unit 14 decodes a received word that is read from the nonvolatile memory 20 to restore the user data. Here, the encoding/decoding unit 14 includes an encoder 17 and a decoder 18. Furthermore, data that is encoded by the encoding/decoding unit 14 may also include control data that is used at the inside of the memory controller 10, and the like in addition to the user data.

Next, writing processing of this embodiment will be described. The control unit 11 instructs the encoder 17 to encode the user data when writing the user data in the nonvolatile memory 20. At this time, the control unit 11 determines a storage location (storage address) of the code word in the nonvolatile memory 20, and gives an instruction for the determined storage location with respect to the memory I/F 13.

The encoder 17 encodes the user data on the data buffer 12 on the basis of the instruction from the control unit 11 to generate a code word. As an encoding method, for example, an encoding method using a Bose-Chandhuri-Hocquenghem (BCH) code or a Reed-Solomon (RS) code can be employed. The code word generated by the encoder 17 is a multi-dimensional error correction code such as the product code 500 that is illustrated with reference to FIG. 2. As described above, the product code 500 illustrated in FIG. 2 has a structure in which respective information bits (may be symbols) $d_0$ to $d_3$ that are constituent units are protected by component codes 511 to 515, and 521 to 525 that are Hamming codes having an information length of two bits and a parity length of two bits both in a row direction (horizontal direction in the drawing) and in a column direction (vertical direction in the drawing). In the product code 500, all of the information bits $d_0$ to $d_3$ and the parity bits $p_0$ to $p_{20}$ are doubly protected by the component codes (Hamming code) 511 to 515 in a row direction and the component codes (Hamming codes) 521 to 525 in a column direction. The memory I/F 13 performs control of storing the code word in the storage location on the nonvolatile memory 20 that is given in instruction from the control unit 11.

Next, processing in reading from the nonvolatile memory 20 of this embodiment will be described. In reading from the nonvolatile memory 20, the control unit 11 designates an address on the nonvolatile memory 20 and instructs the memory I/F 13 to perform reading. In addition, the control unit 11 instructs the decoder 18 to initiate decoding. The memory I/F 13 reads a reception word from the designated address of the nonvolatile memory 20 in accordance with the instruction of the control unit 11, and inputs the read reception word to the decoder 18. The decoder 18 decodes the reception word that is read from the nonvolatile memory 20.

Figure 7:
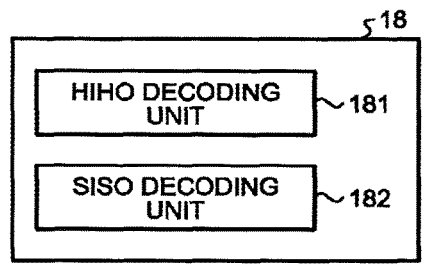
FIG. 7 is a block diagram illustrating a schematic configuration example of a decoder according to the first embodiment.

The decoder 18 decodes the reception word that is read from the nonvolatile memory 20. FIG. 7 is block diagram illustrating a schematic configuration example of the decoder 18. The decoder 18 includes a hard-input hard-output (HIHO) decoding unit 181 that executes decoding by setting a hard-decision value as an input and outputs the hard-decision value as a result, and a soft-input soft-output (SISO) decoding unit 182 that executes decoding by setting a soft-decision value as an input and outputs the soft-decision value as a result.

Typically, SISO decoding has a characteristic that error correction capability is higher but a processing time is longer in comparison to HIHO decoding. Therefore, in this embodiment, first, the HIHO decoding unit 181 performs HIHO decoding of a reception word that is read from the nonvolatile memory 20 as a hard-decision value, and reads a reception word that cannot be decoded by the hard-decision decoding as a soft-decision value. In addition, the SISO decoding unit 182 performs SISO decoding of the reception word that is read as the soft-decision value. However, there is no limitation to the above-described configuration, and it is possible to employ various modifications such as a configuration of executing the SISO decoding with respect to all reception words while omitting the HIHO decoding.

Figure 8:
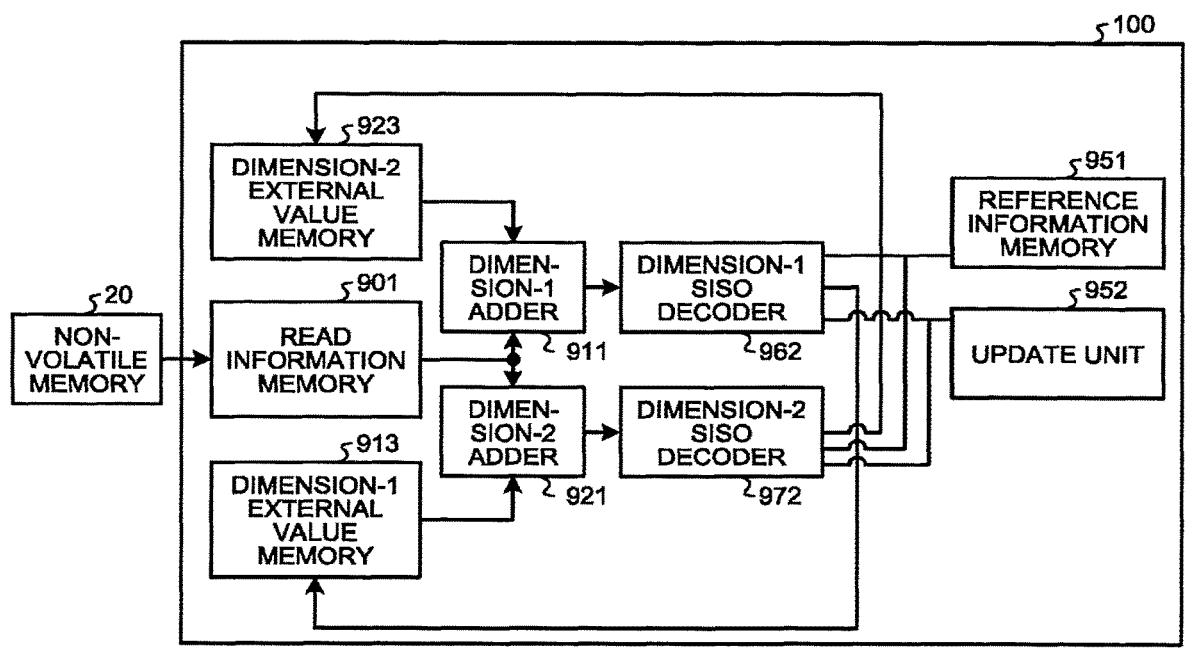
FIG. 8 is a block diagram illustrating a schematic configuration example of a turbo decoder that is realized by an SISO decoding unit according to this embodiment.

Next, a more detailed configuration of the SISO decoding unit 182 illustrated in FIG. 7 will be described in detail with reference to a drawing. FIG. 8 is a block diagram illustrating a schematic configuration example of a turbo decoder 100 that is realized by the SISO decoding unit according to this embodiment.

As illustrated in FIG. 8, the turbo decoder 100 includes a read information memory 901, a dimension-1 adder 911, a dimension-1 SISO decoder 962, a dimension-1 external value memory 913, a dimension-2 adder 921, a dimension-2 SISO decoder 972, a dimension-2 external value memory 923, a reference information memory 951, and an update unit 952.

A configuration of the turbo decoder 100 is different from the configuration illustrated in FIG. 3 in that the reference information memory 951 and the update unit 952 are added, and the dimension-1 SISO decoder 962 and the dimension-2 SISO decoder 972 have functions different from the functions in FIG. 3. Other functions are the same as the functions illustrated in FIG. 3, and thus the same reference numeral will be given and thus description thereof will be omitted.

The reference information memory 951 is a storage unit that stores reference information that is a history of a reliability metric or statistical information obtained from the history of the reliability metric. The update unit 952 updates a reliability calculation function (correspondence information) with reference to the reference information. Details of update processing of the reliability calculation function will be described later.

The dimension-1 SISO decoder 962 is different from the dimension-1 SISO decoder 912 in FIG. 3 in that the dimension-1 SISO decoder 962 stores the reference information based on the calculated reliability metric in the reference information memory 951, and calculates reliability by using a reliability calculation function g(m) given in notification from the update unit 952 and calculates an external value by using the calculated reliability.

The dimension-2 SISO decoder 972 is different from the dimension-2 SISO decoder 922 in FIG. 3 in that the dimension-2 SISO decoder 972 stores the reference information based on the reliability metric in the reference information memory 951, and calculates reliability by using the reliability calculation function g(m) given in notification from the update unit 952 and calculates an external value by using the calculated reliability.

Figure 9:
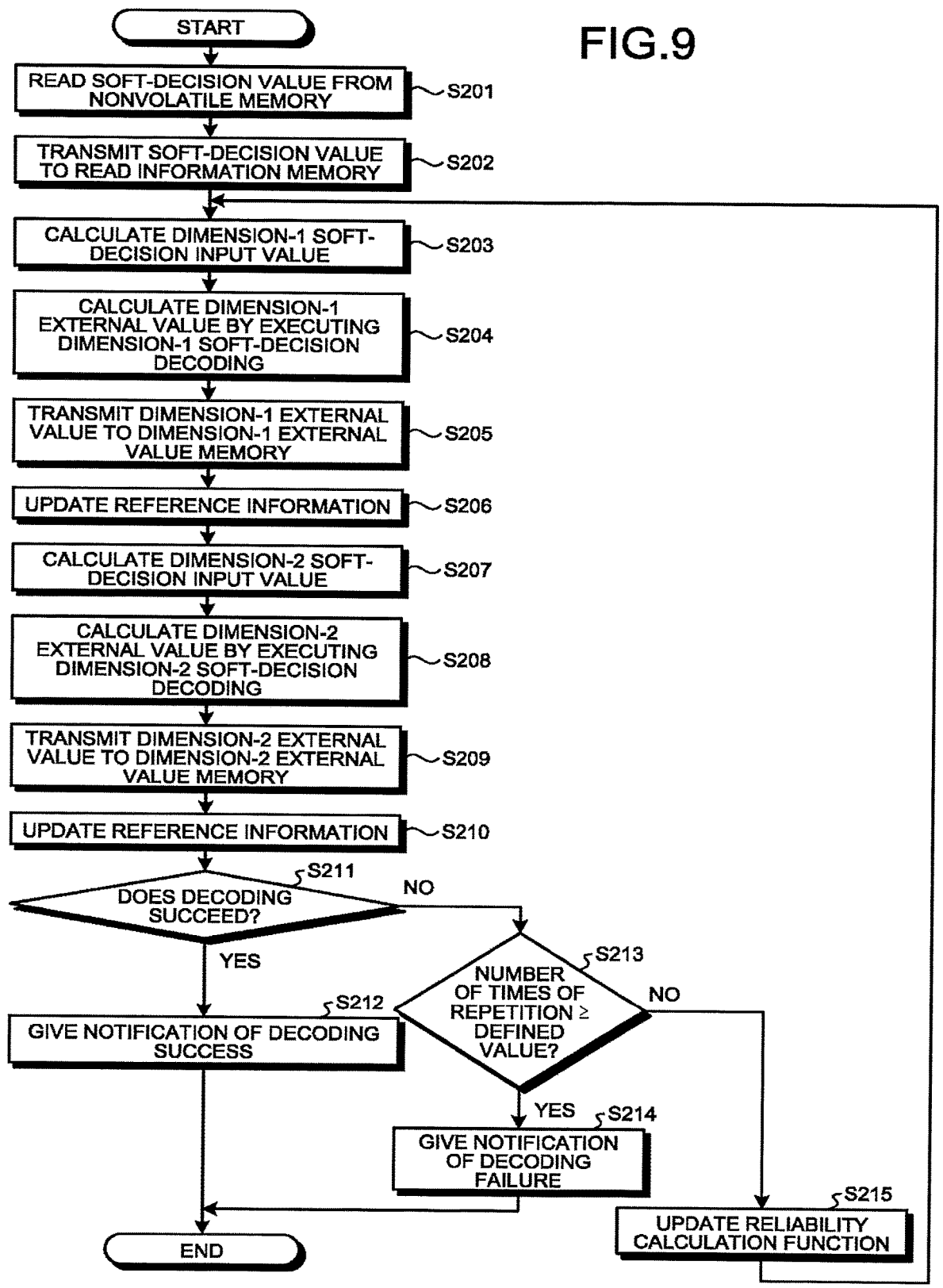
FIG. 9 is a flowchart illustrating an example of decoding processing by the turbo decoder illustrated in FIG. 8.

FIG. 9 is a flowchart illustrating an example of decoding processing by the turbo decoder 100 illustrated in FIG. 8. Furthermore, the update unit 952 initializes the reliability calculation function g(m) to an initial value determined in advance, for example, in activation of the present operation.

In Step S201 to Step S205, the same processing as in Step S901 to Step S905 in FIG. 4 are executed, and thus description thereof will be omitted.

Furthermore, in Step S204, the dimension-1 SISO decoder 962 calculates a dimension-1 external value according to a procedure illustrated in FIG. 5. The reliability calculation function g(m) that is used at this time is given in notification from the update unit 952.

The dimension-1 decoder 962 updates the reference information of the reference information memory 951 whenever calculating the reliability metric m (Step S206). For example, the reference information is a histogram of a value of the reliability metric m (statistical information obtained from the history of the reliability metric). The dimension-1 SISO decoder 962 may further store an empirical distribution P^(m) obtained from the history of the reliability metric m as reference information.

Figure 10:
FIG. 10 is a view illustrating an example of a reliability metric, a histogram, and an empirical distribution.

FIG. 10 is a view illustrating an example of the reliability metric, the histogram, and the empirical distribution. An upper side of FIG. 10 illustrates list of values of the reliability metric m (history of the reliability metric) of respective rows (Rows 1 to 5) and respective columns (Columns 1 to 5) of product codes in five rows and five columns as illustrated in FIG. 2. A lower side of FIG. 10 illustrates the histogram of the reliability metric m and the empirical distribution P^(m) that are calculated from the list.

For example, since a value of m=7 is observed at a Row 4 and a Column 2, a count value of a histogram of m=7 becomes 2. In addition, since the number of rows+the number of columns is 10, a value P^(m=7) of the empirical distribution becomes 2/10=0.2.

FIG. 10 illustrates an example in which the reliability metric m can take integers of 0 to 9. The reliability metric m is not necessary to be a discrete value, and may be a contiguous value. In a case where the reliability metric m is a contiguous value, for example, the reference information memory 951 may store the histogram for every bin obtained by dividing the contiguous value in a predetermined range.

Returning to FIG. 9, the processing (Step S207 to Step S210) by the dimension-2 SISO decoder 972 is also executed in the same manner as in the dimension-1 SISO decoder 962.

In Step S207 to Step S209, the same processing as in Step S906 to Step S908 in FIG. 4 are executed, and the description thereof will be omitted.

Furthermore, in Step S208, the dimension-2 SISO decoder 972 calculates a dimension-2 external value in a procedure illustrated in FIG. 5. The reliability calculation function g(m) that is used at this time is given in notification from the update unit 952.

The dimension-2 SISO decoder 972 updates the reference information of the reference information memory 951 whenever calculating the reliability metric m (Step S210).

In Step S211 to Step S214, the same processing as in Step S909 to Step S912 in FIG. 4 are executed, and thus description thereof will be omitted.

In a case where the number of times of repetition does not reach a defined value (NO in Step S213), the update unit 952 updates the reliability calculation function g(m) (Step S215). The processing returns to Step S203, and the subsequent operation is executed. Details of update processing of the reliability calculation function g(m) will be described later.

As described above, the update unit 952 of the first embodiment dynamically updates the reliability calculation function g(m) that is used in the dimension-1 SISO decoder 962 and the dimension-2 SISO decoder 972. According to this, it is possible to accomplish high correction capability without depending on a configuration of an error correction code that is a decoding target, or a state of a flash memory.

Furthermore, the dimension-1 SISO decoder 962 and the dimension-2 SISO decoder 972 may obtain the histogram of the reliability metric whenever calculating the reliability metric m, and may store a value of the reliability metric in the reference information memory 951 instead of updating the histogram of the reference information memory 951. In other words, the dimension-1 SISO decoder 962 and the dimension-2 SISO decoder 972 may update the history of the reliability metric that is stored in the reference information memory 951 whenever calculating the reliability metric m. In this case, for example, the update unit 952 may calculate the histogram from the history of the reliability metric m and may use the histogram in update of the reliability calculation function g(m).

Next, details of the update processing of the reliability calculation function g(m) will be described. The update unit 952 updates the reliability calculation function g(m), for example, in accordance with the following Expression (2).

$$g(m) = \frac{P(m \mid c = x)P(c = x)}{P(m \mid c = x)P(c = x) + P(m \mid c \neq x)P(c \neq x)} \quad (2)$$

P(m|c=x) represents an appearance probability (first probability) of the reliability metric m under a condition in which a decoded word c is the true decoded word x. P(m|c≠x) represents an appearance probability (second probability) of the reliability metric m under a condition in which the decoded word c is not the true decoded word x. P(c=x) represents a priori probability (third probability) in which the decoded word c is the true decoded word x. P(c≠x) represents a priori probability (fourth probability) of a case where the decoded word c is not the true decoded word x.

Furthermore, a relationship of P(c=x)+P(c≠x)=1 is established between the priori probabilities P(c=x) and P(c≠x). Accordingly, when one of the priori probabilities P(c=x) and P(c≠x) is obtained, the other can also be obtained. In a case where a ratio of the two priori probabilities P(c=x) and P(c≠x), and the like are known, the priori probabilities P(c=x) and P(c≠x) can be calculated. Here, in the following description, the priori probabilities P(c=x) and P(c≠x) are not discriminated, and both of the priori probabilities are referred to as "priori probability". As the priori probability, for example, a fixed value such as a priori probability P(c=x)=P(c≠x)=0.5 can be used.

The update unit 952 can obtain a conditional probability P(m|c=x) and P(m|c≠x) by applying a clustering algorithm on the basis of the empirical distribution P^(m). For example, the update unit 952 can classifying a plurality of reliability metrics into any one of two clusters (assemblies) including a cluster A and a cluster B by applying a clustering (provided that, the number k of clusters=2) based on a k-means algorithm to the empirical distribution P^(m), and can estimate an appearance probability P(m|A) of the reliability metric m under a condition pertaining to the cluster A, and an appearance probability P(m|B) of the reliability metric m under a condition pertaining to the cluster B.

Any one of the cluster A and the cluster B corresponds to a cluster to which the reliability metric calculated from the decoded word c that is the true decoded word x is classified, and the other cluster corresponds to a cluster to which the reliability metric calculated from the decoded word c that is not the true decoded word x is classified. The update unit 952 can make a determination as to which of the cluster A and the cluster B is a cluster to which the reliability metric calculated from the decoded word c that is the true decoded word x is classified by using a relationship that "the smaller the reliability metric m is, the greater a probability φ is". In addition, the update unit 952 can calculate the appearance probability of the reliability metrics in the clusters as any one of P(m|c=x) and P(m|c≠x).

For example, the update unit 952 obtains an expected value of the reliability metric m of each of the clusters, that is, $m_A = E[m|A]$ and $m_B = E[m|B]$. The update unit 952 can obtain the conditional probability P(m|c=x) and P(m|c≠x) as in the following Expression (3) and Expression (4) by using a relationship that "the smaller the reliability metric m is, the greater the probability φ is".

$$P(m \mid c = x) = \begin{cases} P(m \mid A) & \text{if } m_A < m_B \\ P(m \mid B) & \text{if } m_A \geq m_B \end{cases} \quad (3)$$

$$P(m \mid c \neq x) = \begin{cases} P(m \mid B) & \text{if } m_A < m_B \\ P(m \mid A) & \text{if } m_A \geq m_B \end{cases} \quad (4)$$

In a case of expressing the reliability calculation function in a format of a table in which the reliability metric and the reliability are correlated with each other, the update unit 952 may update the table to be a table in which the reliability metric and the reliability are correlated with each other to satisfy Expression (2).

Figure 11:
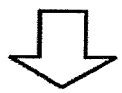
FIG. 11 is a view illustrating an example of processing of obtaining a conditional probability.

FIG. 11 is a view illustrating an example of processing of obtaining the conditional probability P(m|c=x) and P(m|c≠x) by the update unit 952 by using the clustering algorithm.

When the empirical distribution F^(m) illustrated on an upper side of FIG. 11 is given, the update unit 952 can calculate the appearance probability P(m|A) of the reliability metric m under the condition pertaining to the cluster A, and the appearance probability P(m|B) of the reliability metric m under the condition pertaining to the cluster B by applying the k-means algorithm as illustrated on a lower side in FIG. 11.

Here, an expected value of the reliability metric m of the cluster A is 0.67, and an expected value of the reliability metric m of the cluster B is 7.00. Accordingly, it can be seen that the cluster A is a cluster that corresponds to the case where the reliability metric m is small, that is, the decoded word c is the same as the true decoded word x. Accordingly, the update unit 952 can determine that the conditional probability P(m|c=x) is the appearance probability P(m|A), and the conditional probability P(m|c≠x) is the appearance probability P(m|B).

Furthermore, the clustering algorithm that is applicable is not limited to the k-means algorithm, and any clustering algorithm may be applied. For example, it is possible to apply an algorithm such as a parameter estimation method of a mixture distribution based on an expectation maximization (EM) algorithm.

Furthermore, a fixed value may be used as the priori probabilities P(c=x) and P(c≠x) as described above. However, when using a value having a more correct priori probabilities, it is possible to raise approximate accuracy of the reliability by the reliability calculation function g(m).

For example, the update unit 952 can estimate the priori probability by the clustering algorithm as in P(m|c=x) and probability P(m|c≠x). For example, in the parameter estimation method of the mixture distribution based on the EM algorithm, the priori probability is obtained in the middle of estimation. Accordingly, the update unit 952 may use the priori probability that is obtained in the middle of estimation in the update processing of the reliability calculation function g(m).

In addition, typically, a probability that the decoded word c is the same as the true decoded word x (=correction succeeds) increases as the decoding processing is repeated more and more. That is, the number of times of repetition of repetitive decoding and the priori probability have a correlation. In addition, typically, the following relationship is established. When in a hard-decision value calculated from the read information, the dimension-1 external value, and the dimension-2 external value, an error is small, a probability that syndrome calculated with respect to the hard-decision value is 0 becomes higher, and a probability that the decoded word c is the same as the decoded word x (=correction succeeds) becomes higher. That is, "the number of the syndromes each of which is calculated with respect to the hard-decision value and has the value of 0" and the priori probability have a correlation. The update unit 952 can estimate the priori probability from the value having a correlation with the priori probability.

For example, the update unit 952 may increase the priori probability P(c=x) in which the decoded word c is the true decoded word x in accordance with an increase in the number of times of repetition. In addition, for example, the update unit 952 may increase the priori probability P(c=x) in which the decoded word c is the true decoded word x as the number of the syndromes having the value of 0 increases.

The correlation between the reliability metric and the reliability varies depending on conditions such as a stress condition that is applied to a code that is used or a memory system. Accordingly, in a configuration in which a fixed reliability calculation function g(m) optimized with respect to only a condition specified in advance is used, in a case where the stress condition and the like that are applied to the memory system vary, reliability calculation accuracy deteriorates, and as a result, there is a concern that the error correction capability deteriorates. In contrast, in the first embodiment, a reliability calculation function used in soft-decision decoding of the multi-dimensional error correction code is dynamically updated during the decoding processing. According to this, it is possible to calculate the reliability with higher accuracy, and as a result, it is possible to realize high correction capability without depending on the stress condition and the like. In addition, it is not necessary to optimize the reliability calculation function in advance.

Second Embodiment

It is necessary for the turbo decoder using the SISO decoder to store an external value that is probability information in an external value memory, and thus there is a possibility that a memory amount necessary for decoding increases. Here, it is desired to provide a memory system capable of reducing the memory amount necessary for decoding.

In the second embodiment, an example of the memory system capable of reducing the memory amount necessary for decoding will be described. A schematic configuration of the memory system according to the second embodiment is the same as in FIG. 6 that illustrates the schematic configuration of the memory system of the first embodiment, and thus description thereof will be omitted. In the second embodiment, the function of the turbo decoder that is realized by the SISO decoding unit 182 is different from the first embodiment.

Figure 12:
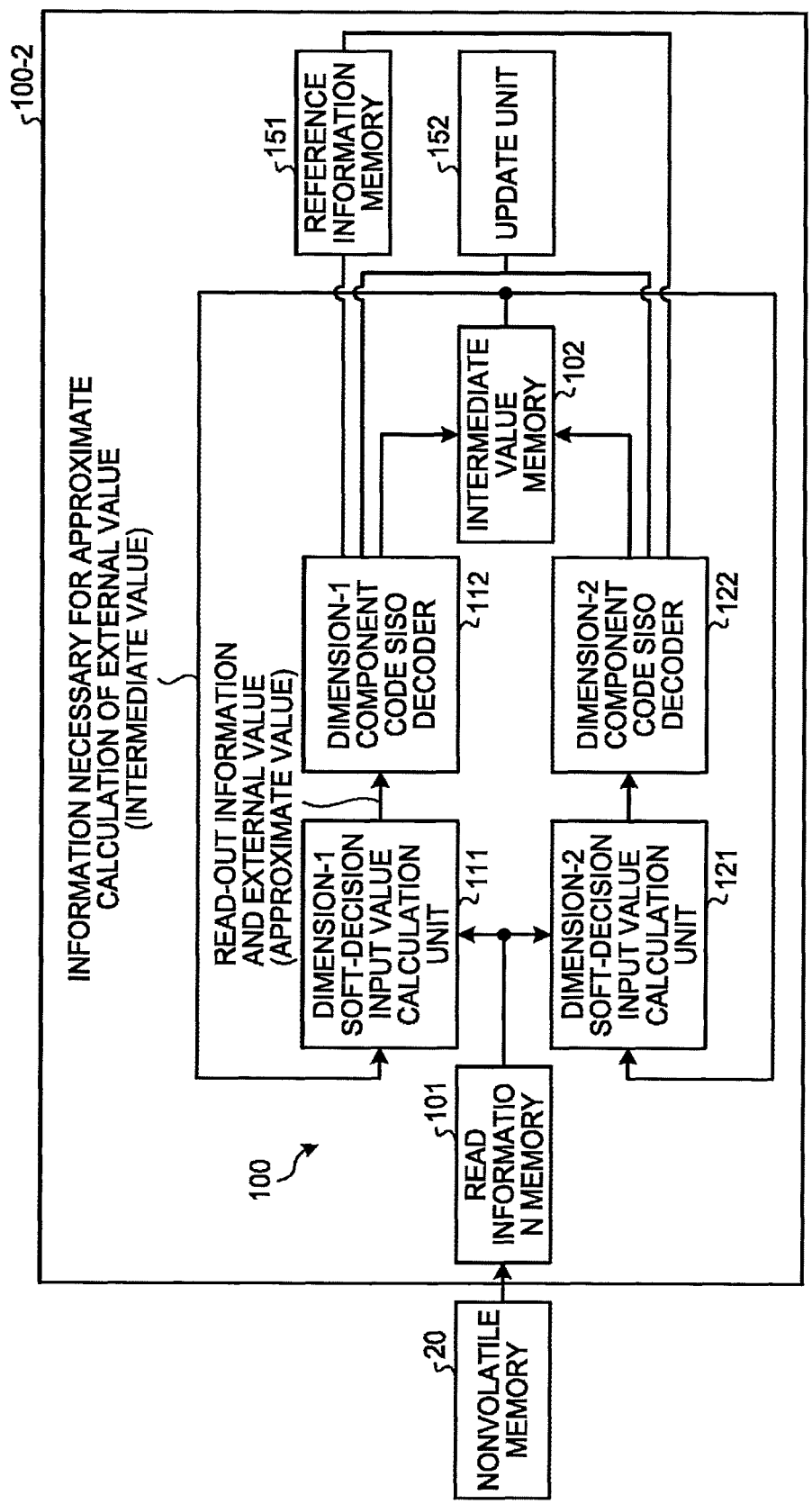
FIG. 12 is a block diagram illustrating a schematic configuration example of an approximate turbo decoder that is realized by the SISO decoding unit according to the first embodiment.
Figure 13:
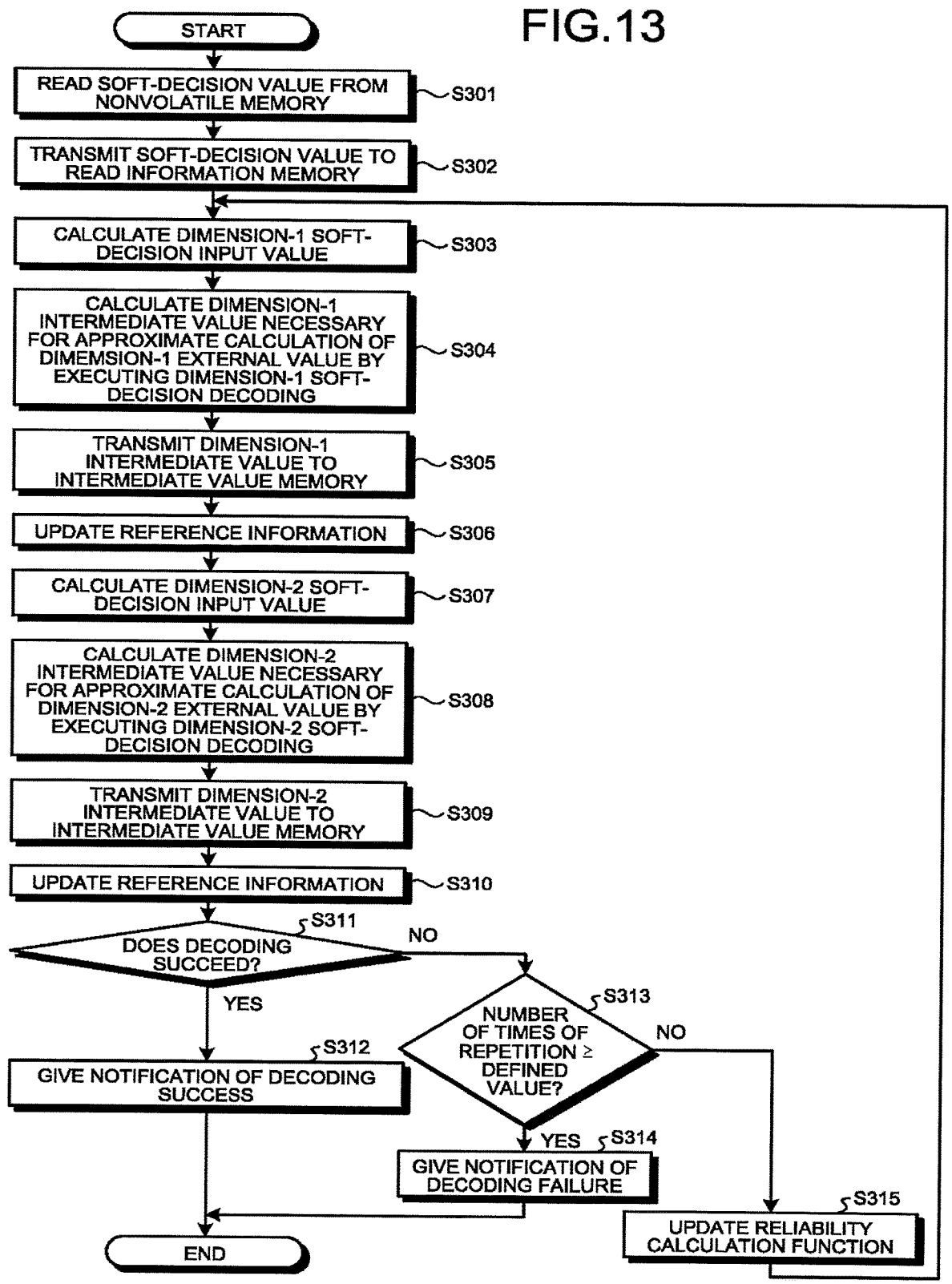
FIG. 13 is a flowchart illustrating an example of a processing flow of the approximate turbo decoder illustrated in FIG. 12.

FIG. 12 is a block diagram illustrating a schematic configuration example of an approximate turbo decoder 100-2 that is realized by an SISO decoding unit according to this embodiment. In addition, FIG. 13 is a flowchart illustrating an example of a processing flow of the approximate turbo decoder 100-2 illustrated in FIG. 12.

As illustrated in FIG. 12, the approximate turbo decoder 100-2 that is realized by an SISO decoding unit 182 includes a read information memory 101, an intermediate value memory 102, a dimension-1 soft-decision input value calculation unit 111, a dimension-1 component code SISO decoder 112, a dimension-2 soft-decision input value calculation unit 121, a dimension-2 component code SISO decoder 122, a reference information memory 151, and an update unit 152.

The dimension-1 soft-decision input value calculation unit 111 and the dimension-2 soft-decision input value calculation unit 121 calculate soft-decision input values of respective dimensions from read information of a soft-decision value stored in the read information memory 101, and an intermediate value of a dimension 1 (dimension-1 intermediate value) and an intermediate value of a dimension 2 (dimension-2 intermediate value) that are stored in the intermediate value memory 102 for every component code.

Furthermore, each of the intermediate values is information including an intermediate hard-decision value of each component code that is calculated in the middle of decoding, and reliability of the intermediate hard-decision value, and is information necessary for approximate calculation of an external value of the dimension 1 (dimension-1 external value) and an external value of the dimension 2 (dimension-2 external value). In this embodiment, the reliability of the intermediate hard-decision value is calculated by the reliability calculation function. Details of a method of calculating the reliability of the intermediate hard-decision value will be described later.

The dimension-1 component code SISO decoder 112 and the dimension-2 component code SISO decoder 122 calculate the intermediate values of the respective dimensions by executing SISO decoding with respect to the input soft-decision input values of the respective dimensions for every component code.

In this embodiment, the intermediate values of the respective dimensions, that is, the intermediate hard-decision values of respective component codes, that is, decoded words, and the reliability of the intermediate hard-decision values, that is, the reliability of the decodes words correspond to decoding information that is used in decoding processing. The dimension-1 component code SISO decoder 112 and the dimension-2 component code SISO decoder 122 calculate the reliability of the intermediate hard-decision values by using the reliability calculation function g(m) that is given in notification from the update unit 152. In addition, the dimension-1 component code SISO decoder 112 stores reference information based on the reliability metric in the reference information memory 151.

The reference information memory 151 is a storage unit that stores reference information that is a history of a reliability metric or statistical information obtained from the history of the reliability metric. The update unit 152 updates a reliability calculation function (correspondence information) with reference to the reference information.

In a turbo decoding operation by the approximate turbo decoder 100-2 illustrated in FIG. 12, as illustrated in FIG.

13, first, a multi-dimensional error correction code is read from the nonvolatile memory 20 as a soft-decision value (Step S301). The multi-dimensional error correction de of the read soft-decision value is transmitted to the read information memory 101 as read information and is stored therein (Step S302).

Next, the read information in the read information memory 101 and the dimension-1 intermediate value and the dimension-2 intermediate value in the intermediate value memory 102 are input to the dimension-1 soft-decision input value calculation unit 111 to calculate a dimension-1 soft-decision input value (Step S303). Furthermore, it is assumed that the intermediate value memory 102 is reset (zero clear) in activation of the present operation. Accordingly, in first calculation processing of the dimension-1 soft-decision input value, as the dimension-1 intermediate value and the dimension-2 intermediate value, for example, data in which 0 bit is contiguous is input to the dimension-1 soft-decision input value calculation unit 111.

Next, a dimension-1 soft-decision input value that is calculated by the dimension-1 soft-decision input value calculation unit 111 is input to the dimension-1 component code SISO decoder 112 for every component code of the dimension 1, and the dimension-1 intermediate value, that is, a decoded word and reliability of the decoded word are calculated (Step S304). The dimension-1 component code SISO decoder 112 calculates the reliability of the decoded word by the same processing as in the first embodiment. The calculated dimension-1 intermediate value is transmitted to the intermediate value memory 102 and is stored therein (Step S305).

The dimension-1 component code SISO decoder 112 calculates the reliability metric in calculation of the dimension-1 intermediate value. The dimension-1 component code SISO decoder 112 updates the reference information in the reference information memory 151 whenever calculating the reliability metric m (Step S306). For example, the reference information is a histogram of a value of the reliability metric m.

Next, read information in the read information memory 101 and the dimension-1 intermediate value and the dimension-2 intermediate value in the intermediate value memory 102 are input to the dimension-2 soft-decision input value calculation unit 121 to calculate the dimension-2 soft-decision input value (Step S307). Furthermore, since the dimension-2 intermediate value is not stored in the intermediate value memory 102 in the first calculation processing of the dimension-2 soft-decision input value, in the first calculation processing of the dimension-2 soft-decision input value, the dimension-1 intermediate value, and for example, data in which 0 bit is contiguous are input to the dimension-2 soft-decision input value calculation unit 121.

Next, the dimension-2 soft-decision input value calculated by the dimension-2 soft-decision input value calculation unit 121 is input to the dimension-2 component code SISO decoder 122 for every component code of the dimension 2 to calculate the dimension-2 intermediate value, that is, a decoded word and reliability of the decoded word (Step S308). The dimension-2 component code SISO decoder 122 calculates the reliability of the decoded word by the same processing as in the first embodiment. The dimension-2 intermediate value that is calculated is transmitted to the intermediate value memory 102 and is stored therein (Step S309).

The dimension-2 component code SISO decoder 122 calculates the reliability metric in calculation of the dimension-2 intermediate value. The dimension-2 component code SISO decoder 122 updates the reference information in the reference information memory 151 whenever calculating the reliability metric m (Step S310).

Next, determination is made as to whether or not decoding succeeds (Step S311). Determination as success of the decoding may be made, for example, when a decoded word that can be determined as a correct word is found. In addition, determination as to whether or not the found decoded word is correct may be executed, for example, by control unit (not illustrated) in the encoding/decoding unit 14. In a case where decoding succeeds (YES in Step S311), an external control unit 11 and the like are notified of a decoded word that is found in combination with the success of the decoding (Step S312), and this operation is terminated. On the other hand, in a case where the decoding fails (NO in Step S311), determination is made as to whether or not the number of times of repetition of this operation reaches a defined value that is set in advance (Step S313).

In a case where the number of times of repetition does not reach the defined value (NO in Step S313), the update unit 152 updates the reliability calculation function g(m) (Step S315), the operation returns to Step S303, and the subsequent operation is executed. The update unit 152 can update the reliability calculation function g(m) in the same procedure as in the update unit 952 of the first embodiment.

In addition, in a case where the number of times of repetition reaches the defined value (YES in Step S313), the external control unit 11 and the like are notified of decoding failure (Step S314), and this operation is terminated. Furthermore, for example, the number of times of repetition may be the number of times of repetition of the operation in Steps S303 to S310 in FIG. 13.

Figure 14:
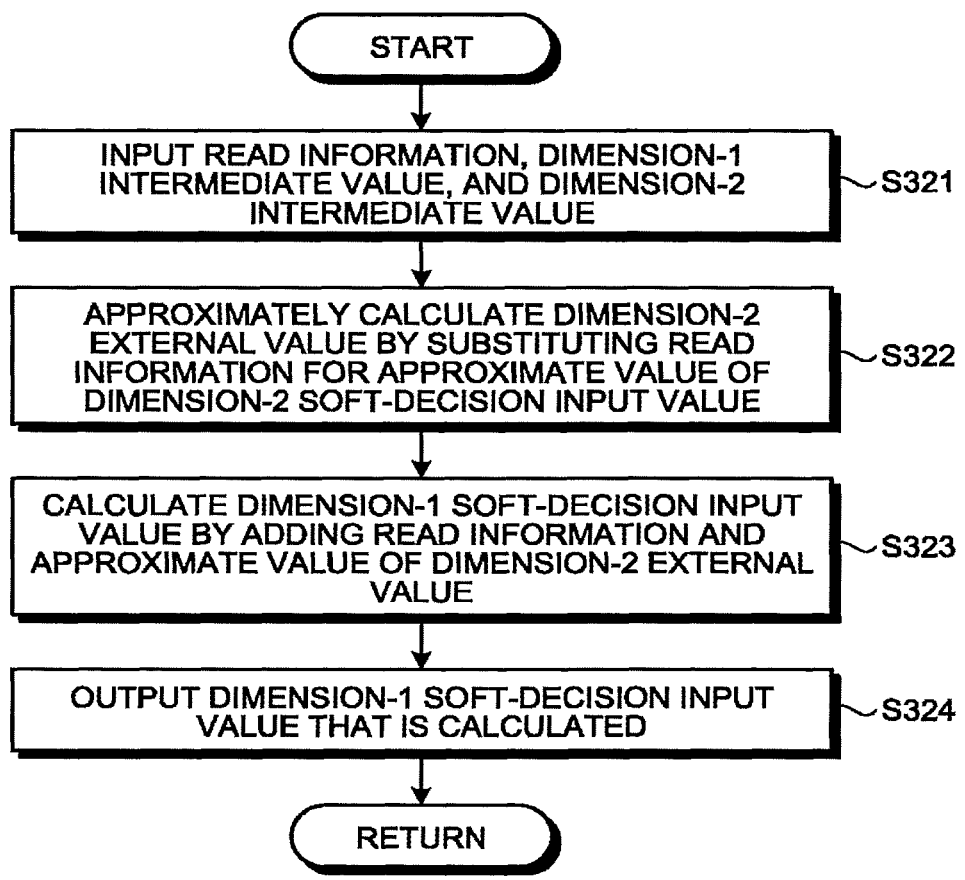
FIG. 14 is a flowchart illustrating an example of an operation flow of a dimension-1 soft-decision input value calculation unit according to a second embodiment.

Next, an operation flow when the dimension-1 soft-decision input value calculation unit 111 and the dimension-2 soft-decision input value calculation unit 121 in FIG. 12 calculate the dimension-1 soft-decision input value and the dimension-2 soft-decision input value in Steps S303 and S306 in FIG. 13 will be described in detail with reference to the drawings. FIG. 14 is a flowchart illustrating an example of an operation flow of a dimension-1 soft-decision input value calculation unit according to this embodiment. Furthermore, in FIG. 14, the operation of the dimension-1 soft-decision input value calculation unit 111 is illustrated, but the same operation is applicable to the dimension-2 soft-decision input value calculation unit 121.

As illustrated in FIG. 14, when the dimension-1 soft-decision input value calculation unit 111 calculates the dimension-1 soft-decision input value, first, read information is input from the read information memory 101, and the dimension-1 intermediate value and the dimension-2 intermediate value are input from the intermediate value memory 102 (Step S321).

Next, the dimension-1 soft-decision input value calculation unit 111 calculates an approximate value of the dimension-2 external value from the read information, the dimension-1 intermediate value, and the dimension-2 intermediate value that are input. Specifically, the dimension-1 soft-decision input value calculation unit 111 calculates the dimension-2 external value from a decoded word of the dimension 2 and reliability of the decoded word of the dimension 2 in the dimension-2 intermediate value in accordance with Expression (1).

Provided that, a value of a dimension-2 soft-decision input value r is necessary to calculate Expression (1), but in this embodiment, the dimension-2 soft-decision input value is not known at this point of time. Therefore, in this embodiment, the approximate value of the dimension-2 external value is calculated by substituting the read information for an approximate value of the dimension-2 soft-decision input value r (Step S322).

Next, the approximate value of the dimension-2 external value that is calculated in Step S322, and the read information are added up to calculate the dimension-1 soft-decision input value (Step S323). Then, the dimension-1 soft-decision input value that is calculated is output to the dimension-1 component code SISO decoder 112 for every component code of the dimension 1 (Step S324), and the operation returns to the operation illustrated in FIG. 13.

As described above, even in a case where the read information is substituted for the approximate value of soft-decision input value, the soft-decision input value that is finally calculated well approximates to the soft-decision input value to be calculated in the original turbo decoding. This implies that the external value memories of the respective dimensions (the dimension-1 external value memory 913 and the dimension-2 external value memory 923), for example, in the configuration illustrated in FIG. 3 can be substituted with the intermediate value memory 102 having smaller capacity according to this embodiment.

Specifically, memories that store the external values for every dimension are necessary in the first embodiment. However, in this embodiment, the hard-decision value (corresponding to the decoded word) and the reliability of the decoded word may be stored as the external values, and one memory may be shared with respect to all dimensions. As a result, according to this embodiment, it is possible to reduce a memory amount necessary for decoding.

As described above, even in the second embodiment it is possible to dynamically update the reliability calculation function that is used in the soft-decision decoding in the middle of decoding processing as in the first embodiment. In addition, in the second embodiment, it is possible to reduce the memory amount necessary for decoding.

Third Embodiment

Next, a memory system according to a third embodiment will be described in detail with reference to the drawings. A configuration of the memory system including an encoding/decoding unit in this embodiment is the same as in the memory system illustrated with reference to FIG. 5, FIG. 6, and FIG. 12 in the second embodiment, and thus redundant description thereof will be omitted. In addition, a processing flow of an approximate turbo decoder according to this embodiment may be also the same as the processing flow illustrated with reference to FIG. 13 in the second embodiment, and thus redundant description thereof will be omitted. However, in this embodiment, an operation flow of the dimension-1 soft-decision input value calculation unit 111 and the dimension-2 soft-decision input value calculation unit 121 is different from the operation flow illustrated with reference to FIG. 14 in the second embodiment.

Figure 15:
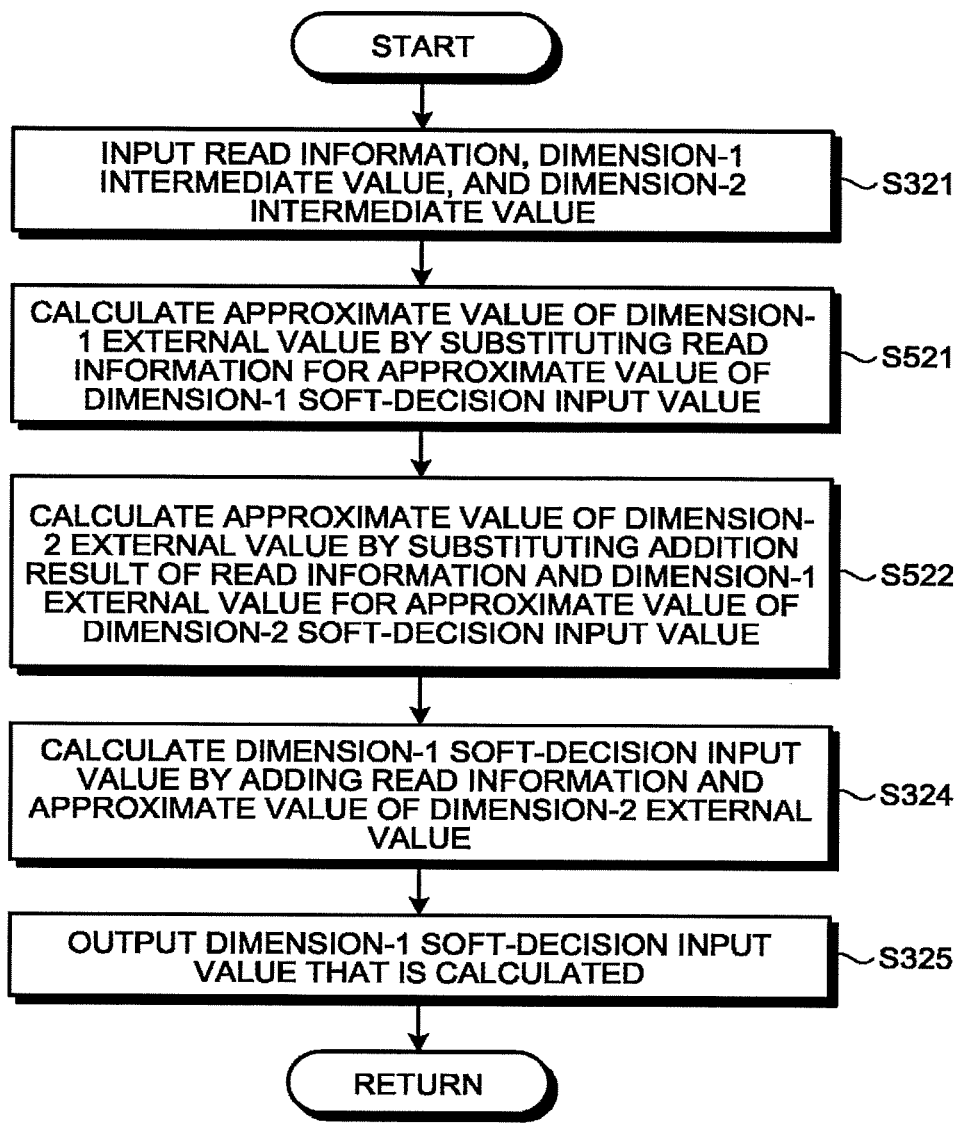
FIG. 15 is a flowchart illustrating an example of an operation flow of a dimension-1 soft-decision input value calculation unit according to a third embodiment.

FIG. 15 is a flowchart illustrating an example of an operation flow of a dimension-1 soft-decision input value calculation unit according to this embodiment. Furthermore, in FIG. 15, an operation of the dimension-1 soft-decision input value calculation unit 111 is illustrated, but the same operation is applicable to the dimension-2 soft-decision input value calculation unit 121. In addition, in the operation illustrated in FIG. 15, the same reference numeral will be given to the same operation as the operation illustrated in FIG. 14, and detailed description thereof will be omitted.

As illustrated in FIG. 15, in the dimension-1 soft-decision input value calculation unit 111, first, in the same manner as in Step S321 in FIG. 14, the read information, the dimension-1 intermediate value, and the dimension-2 intermediate value are input to calculate an approximate value of the dimension-2 external value from the read information, the dimension-1 intermediate value, and the dimension-2 intermediate value that are input. In this embodiment, the dimension-1 soft-decision input value calculation unit 111 calculates the approximate value of the external value of the dimension 1 from the decoded word of the dimension 1 and the reliability of the decoded word of the dimension 1 in the dimension-1 intermediate value on the basis of Expression (1). Provided that, a value of a soft-decision input value r is necessary to calculate Expression (1), but in this embodiment, the dimension-1 soft-decision input value is not known at this point of time. Therefore, in this embodiment, the approximate value of the dimension-1 external value is calculated by substituting the read information for an approximate value of the dimension-1 soft-decision input value (Step S521).

Next, the dimension-1 soft-decision input value calculation unit 111 calculates an approximate value of an external value of the dimension 2 from a decoded word of the dimension 2 and reliability of the decoded word of the dimension 2 in the dimension-1 intermediate value on the basis of Expression (1). Provided that, a dimension-2 soft-decision input value r is necessary to calculate Expression (1), but in this embodiment, the dimension-2 soft-decision input value is not known at this point of time. Therefore, in this embodiment, the approximate value of the dimension-2 external value is calculated by substituting the addition result of the read information and the dimension-1 external value for an approximate value of the dimension-2 soft-decision input value (Step S522).

Then, the dimension-1 soft-decision input value calculation unit 111 performs the same operation as the operation illustrated in Steps S324 and S325 in FIG. 14 to add the approximate value of the dimension-2 external value and the read information, thereby calculating the dimension-1 soft-decision input value (Step S523). The dimension-1 soft-decision input value calculation unit 111 outputs the calculated dimension-1 soft-decision input value to the dimension-1 component code SISO decoder 112 for every component code of the dimension 1 (Step S524), and the operation returns to the operation illustrated in FIG. 13.

As described above, even in a case of substituting a logarithmic posteriori probability ratio of one dimension for an approximate value of a soft-decision input value of the other dimension, the soft-decision input value that is finally calculated well approximates to the soft-decision input value to be calculated in the original turbo decoding. According to this, as in the second embodiment, the external value memories of the respective dimensions (the dimension-1 external value memory 913 and the dimension-2 external value memory 923), for example, in the configuration illustrated in FIG. 3 can be substituted with the intermediate value memory 102 having smaller capacity, and it is possible to reduce a memory amount necessary for decoding.

The other configurations, operations, and effects are the same as in the above-described embodiments, and thus detailed description thereof will be omitted.

Fourth Embodiment

Next, a memory system according to a fourth embodiment will be described. The operation flow of the dimension-1 soft-decision input value calculation unit 111 and the dimension-2 soft-decision input value calculation unit 121 illustrated with reference to FIG. 14 in the second embodiment, and the operation flow of the dimension-1 soft-decision input value calculation unit 111 and the dimension soft-decision input value calculation unit 121 illustrated with reference to FIG. 15 in the third embodiment can be used properly by selectively switching the operation flows in a specified condition. The operation flows executed on the basis of the reliability of the decoded word can be switched as follows. That is, in a case where the reliability of the decoded word of the dimension 1 or the dimension 2 is higher than a threshold value that is determined in advance, the dimension-1 soft-decision input value or the dimension-2 soft-decision input value is obtained by using the operation flow illustrated in FIG. 15, and in other cases, the dimension-1 soft-decision input value or the dimension-2 soft-decision input value is obtained by using the operation flow illustrated in FIG. 14.

Even in this configuration, as in the above-described embodiments, the external value memories 913 and 923 of the respective dimensions, for example, in the configuration illustrated in FIG. 3 can be substituted with the intermediate value memory 102 having smaller capacity, and it is possible to reduce a memory amount necessary for decoding.

The other configurations, operations, and effects are the same as in the above-described embodiments, and thus detailed description thereof will be omitted.

Modification Example 1

In the above-described embodiments, for example, the reliability calculation function g(m) that is common to the respective dimensions is used. The reliability calculation function g(m) may be changed in accordance with a rule that is determined in advance.

As the rule of changing the reliability calculation function g(m), for example, the following rules (R1) to (R3) can be used.

(R1) Between a case of decoding a component code of the dimension 1 and a case of decoding a component code of the dimension 2, a reliability calculation function g(m) different in each case is used.

(R2) In a case where a plurality of kinds of decoders (for example, a bounded distance decoder, a chase decoder, an ordered statistics decoder, and the like) are used to obtain the decoded word c, a different reliability calculation functions g(m) is used in accordance with a situation in which the decoded word is obtained from which decoder.

(R3) In a case where a plurality of kinds of decoders are used to obtain the decoded word c, a different reliability calculation function g(m) is used in accordance with whether or not the decoded words c output from the plurality of kinds of decoders match each other.

In the case of (R3), for example, each of the decoders determines the reliability calculation function g(m) that is used as follows.

(R3-1) A common reliability calculation function g(m) is used with respect to decoders in which the decoded words c match each other, and individual reliability calculation functions g(m) determined for respective decoders are used with respect to decoders in which the decoded words c do not match each other.

(R3-2) A first common reliability calculation function g(m), which is determined as a function in a case where the decoded words c match each other, is used with respect to decoders in which the decoded words c match each other, and a second common reliability calculation function g(m), which is determined as a function in a case where the decoded words c do not match each other, is used with respect to decoders in which the decoded words c do not match each other.

(R3-3) In a case where the decoded words c of all decoders match each other, a common reliability calculation function g(m) is used. In a case where decoders, in which the decoded words c do not match each other, exist, only a decoder that is estimated as a correct one is used, and the reliability calculation function g(m) determined with respect to the decoder is used.

In a case of using another reliability calculation function g(m), the update unit (the update unit 952, the update unit 152) uses an initial value that is different for every reliability calculation function g(m) in initialization. In addition, the reference information memory (the reference information memory 951, the reference information memory 151) stores a histogram of the reliability metric m that is different for every reliability calculation function g(m). In addition, the update unit (the update unit 952, the update unit 152) calculates an update value for every reliability calculation function g(m).

Figure 16:
FIG. 16 is a view illustrating an example of storing a histogram of a reliability metric that is different for every dimension.

FIG. 16 is a view illustrating an example of storing the histogram of the reliability metric m that is different for every dimension. FIG. 16 illustrates an example of a histogram and an empirical distribution of the reliability metric m of the dimension 1 corresponding to Rows 1 to 5, and a histogram and an empirical distribution of the reliability metric m of the dimension corresponding to Columns 1 to 5.

As described above, when using different reliability calculation function g(m) in accordance with the rules, the reliability calculation function g(m) approximates to the reliability $\phi=P(c=x|r)$ with higher accuracy, and thus it is expected that more excellent correction capacity can be obtained.

Modification Example 2

The update unit (the update unit 952, the update unit 152) may execute the update processing of the reliability calculation function g(m) in parallel to at least a part of another processing. In a case of using a reliability calculation function g(m) different for every dimension as in (R1) of Modification Example 1, during execution of decoding processing of any one dimension among a plurality of dimensions, the update unit may execute update processing of the reliability calculation function g(m) that is used in the other dimension.

Modification Example 3

Description has been mainly given of the two-dimensional error correction code as an example, but the above-described embodiments are similarly applicable to an error correction code of a three-dimension or higher. In addition, the above-described embodiments are also applicable to an error correction code such as the BCH code and the RS code that are not multi-dimensional codes. For example, the above-described embodiments are also applicable to a configuration in which decoding processing is executed a plurality of times with respect to an error correction code that is not the multi-dimensional code and a final decoding result is output, and the reliability metric and the reliability are calculated in each decoding processing as described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory that stores an error correction code; and
a memory controller, wherein
the memory controller
performs processing of acquiring read information from the nonvolatile memory,
calculates a reliability metric that is information having a correlation with reliability of a decoded word on the basis of a soft-decision input value calculated on the basis of at least the read information, and the decoded word decoded by the soft-decision input value,
stores reference information that is a history of a plurality of the reliability metrics or statistical information obtained from the history,
calculates the reliability from the reliability metric by using correspondence information for calculating the reliability from the reliability metric,
calculates decoding information on the basis of the decoded word and the reliability, and
updates the correspondence information on the basis of the reference information.

2. The memory system according to claim 1, wherein
the nonvolatile memory stores a multi-dimensional error correction code in which at least one symbol among symbols that constitute the code is protected by at least a first component code and a second component code different from the first component code, and
the memory controller calculates the soft-decision input value of the second component code on the basis of at least decoding information of the first component code and the read information.

3. The memory system according to claim 2, wherein
the decoding information includes an external value of the first component code and an external value of the second component code.

4. The memory system according to claim 2, wherein
the decoding information includes the decoded word and the reliability of the decoded word.

5. The memory system according to claim 2, wherein
the memory controller uses first correspondence information for calculating the reliability from the reliability metric with respect to the first component code, and uses second correspondence information for calculating the reliability from the reliability metric with respect to the second component code.

6. The memory system according to claim 1, wherein
the reliability metric is a distance between the soft-decision input value and the decoded word.

7. The memory system according to claim 1, wherein
the correspondence information includes a first probability that is an appearance probability of the reliability metric under a condition in which the decoded word is a correct decoded word, and a second probability that is an appearance probability of the reliability metric under a condition in which the decoded word is not the correct decoded word, and
the memory controller,
classifies a plurality of the reliability metrics into a first assembly including the reliability metric that is calculated from the correct decoded word and a second assembly including the reliability metric that is calculated from the decoded word that is not correct by using the reference information,
calculates the first probability from the appearance probability of the reliability metric in the first assembly,
calculates the second probability from the appearance probability of the reliability metric in the second assembly, and
updates the correspondence information by using the first probability that is calculated and the second probability that is calculated.

8. The memory system according to claim 7, wherein
the correspondence information includes a third probability indicating a priori probability that the decoded word is the correct decoded word, and a fourth probability indicating a priori probability that the decoded word is not the correct decoded word, and
the memory controller,
calculates the third probability and the fourth probability when classifying the plurality of reliability metrics into the first assembly and the second assembly, and
updates the correspondence information by using the third probability that is calculated and the fourth probability that is calculated.

9. The memory system according to claim 1, wherein
the correspondence information includes a third probability indicating a priori probability that the decoded word is a correct decoded word, and a fourth probability indicating a priori probability that the decoded word is not the correct decoded word, and
the memory controller estimates the third probability and the fourth probability on the basis of the number of times of repetition of decoding processing.

10. The memory system according to claim 1, wherein
the correspondence information includes a third probability indicating a priori probability that the decoded word is a correct decoded word, and a fourth probability indicating a priori probability that the decoded word is not the correct decoded word, and
the memory controller calculates a hard-decision value on the basis of the read information and the decoding information, and estimates the third probability and the fourth probability on the basis of syndromes that are calculated with respect to the hard-decision value.

11. The memory system according to claim 1, wherein
the memory controller executes processing of updating the correspondence information in parallel to at least one of calculation of the reliability metric and calculation of the reliability.

12. A method of controlling a nonvolatile memory, the method comprising:
acquiring read information from the nonvolatile memory that stores an error correction code;
calculating a reliability metric that is information having a correlation with reliability of a decoded word on the basis of a soft-decision input value calculated on the basis of at least the read information, and the decoded word decoded by the soft-decision input value;
storing reference information that is a history of a plurality of the reliability metrics or statistical information obtained from the history;
calculating the reliability from the reliability metric by using correspondence information for calculating the reliability from the reliability metric;

calculating decoding information on the basis of the decoded word and the reliability; and updating the correspondence information on the basis of the reference information.

13. The method according to claim 12, wherein
the nonvolatile memory stores a multi-dimensional error correction code in which at least one symbol among symbols that constitute the code is protected by at least a first component code and a second component code different from the first component code, and
the soft-decision input value of the second component code is calculated on the basis of at least decoding information of the first component code and the read information.

14. The method according to claim 13, wherein
the decoding information includes an external value of the first component code and an external value of the second component code.

15. The method according to claim 13, wherein
the decoding information includes the decoded word and the reliability of the decoded word.

16. The method according to claim 13, wherein
first correspondence information for calculating the reliability from the reliability metric is used with respect to the first component code, and second correspondence information for calculating the reliability from the reliability metric is used with respect to the second component code.

17. The method according to claim 12, wherein
the reliability metric is a distance between the soft-decision input value and the decoded word.

18. The method according to claim 12, wherein
the correspondence information includes a first probability that is an appearance probability of the reliability metric under a condition in which the decoded word is a correct decoded word, and a second probability that is an appearance probability of the reliability metric under a condition in which the decoded word is not the correct decoded word, and a plurality of the reliability metrics are classified into a first assembly including the reliability metric that is calculated from the correct decoded word and a second assembly including the reliability metric that is calculated from the decoded word that is not correct by using the reference information, the first probability is calculated from the appearance probability of the reliability metric in the first assembly, the second probability is calculated from the appearance probability of the reliability metric in the second assembly, and the correspondence information is updated by using the first probability that is calculated and the second probability that is calculated.

19. The method according to claim 12, wherein
the correspondence information includes d probability indicating a priori probability that the decoded word is a correct decoded word, and a fourth probability indicating a priori probability that the decoded word is not the correct decoded word, and the third probability and the fourth probability are estimated on the basis of the number of times of repetition of decoding processing.

20. The method according to claim 12, wherein
the correspondence information includes a third probability indicating a priori probability that the decoded word is a correct decoded word, and a fourth probability indicating a priori probability that the decoded word is not the correct decoded word, and a hard-decision value is calculated on the basis of the read information and the decoding information, and the third probability and the fourth probability are estimated on the basis of syndromes that are calculated with respect to the hard-decision value.

* * * * *